(12) United States Patent
Sniegowski et al.

(10) Patent No.: US 6,808,952 B1
(45) Date of Patent: Oct. 26, 2004

(54) PROCESS FOR FABRICATING A MICROELECTROMECHANICAL STRUCTURE

(75) Inventors: Jeffry J. Sniegowski, Albuquerque, NM (US); Thomas W. Krygowski, Cortlandt Manon, NY (US); Seethambal S. Mani, Albuquerque, NM (US); Scott D. Habermehl, Corrales, NM (US); Dale L. Hetherington, Albuquerque, NM (US); James E. Stevens, Albuquerque, NM (US); Paul J. Resnick, Albuquerque, NM (US); Steven R. Volk, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 231 days.

(21) Appl. No.: 10/236,631

(22) Filed: Sep. 5, 2002

(51) Int. Cl.[7] .............................................. H01L 21/00
(52) U.S. Cl. .............................. 438/48; 438/50; 438/53
(58) Field of Search ................................ 438/48–54, 14

(56) References Cited

U.S. PATENT DOCUMENTS

| | | | |
|---|---|---|---|
| 5,134,303 A | 7/1992 | Blech et al. | 250/560 |
| 5,248,889 A | 9/1993 | Blech et al. | 250/561 |
| 5,804,084 A | 9/1998 | Nasby et al. | 216/2 |
| 6,082,208 A | 7/2000 | Rodgers et al. | 74/406 |
| 6,133,670 A | 10/2000 | Rodgers et al. | 310/309 |
| 6,267,605 B1 * | 7/2001 | Biegelsen | 439/81 |

OTHER PUBLICATIONS

Dale L. Hetherington and Jeffry J. Sniegowski, "Improved Polysilicon Surface–Micromachined Micromirror Devices Using Chemical–Mechanical Polishing," *Proceedings of the SPIE Conference on Photonics for Space Environments VI*, SPIE vol. 3440, pp. 148–153, Jul. 1998.

* cited by examiner

*Primary Examiner*—H. Jey Tsai
(74) *Attorney, Agent, or Firm*—John P. Hohimer

(57) ABSTRACT

A process is disclosed for forming a microelectromechanical (MEM) structure on a substrate having from 5 to 6 or more layers of deposited and patterned polysilicon. The process is based on determining a radius of curvature of the substrate which is bowed due to accumulated stress in the layers of polysilicon and a sacrificial material used to buildup the MEM structure, and then providing one or more stress-compensation layers on a backside of the substrate to flatten the substrate and allow further processing.

36 Claims, 9 Drawing Sheets

US 6,808,952 B1

PROCESS FOR FABRICATING A MICROELECTROMECHANICAL STRUCTURE

GOVERNMENT RIGHTS

This invention was made with Government support under Contract No. DE-AC04-94AL85000 awarded by the U.S. Department of Energy. The Government has certain rights in the invention.

FIELD OF THE INVENTION

The present invention relates in general to surface micromachining, and in particular to a process for fabricating a microelectromechanical (MEM) structure on a substrate from at least five and generally six or more layers of polysilicon.

BACKGROUND OF THE INVENTION

Surface micromachining, which is based on conventional integrated circuit (IC) processing technology, can be used to fabricate many different types of microelectromechanical (MEM) device structures on a substrate including accelerometers, micromotors, gear trains, moveable stages, tiltable micromirrors, etc. With each added level of polycrystalline silicon (also termed polysilicon) that can be deposited and patterned to build up the MEM structure, additional design information or complexity can be built into the MEM structure. Additionally, multiple levels of polysilicon can be connected together vertically to provide a greater out-of-plane rigidity for the MEM structure. The use of multiple connected levels of polysilicon can also produce electrostatic actuators having a larger output force.

A current limitation in the number of layers of polysilicon that can be used to form a MEM structure arises from accumulated stress in the polysilicon and a sacrificial material disposed between the polysilicon layers during construction of the device. Annealing at an elevated temperature helps to reduce the stress in the various polysilicon layers but does not substantially reduce the stress in certain types of sacrificial material (e.g. $SiO_2$). As a result, the accumulated stress generally limits MEM device structures to about three or four layers of polysilicon depending upon the thickness of the sacrificial material between the polysilicon layers. With a deviation from a standard processing schedule, it has been possible to fabricate MEM device structures having five layers of polysilicon (see e.g. U.S. Pat. No. 6,082,208 to Rodgers et al, which is incorporated herein by reference). However, it has not been possible heretofore to fabricate a MEM device structure having six layers (also termed levels) of polysilicon due to the presence of the accumulated stress which becomes excessive and bows the substrate to such an extent that photolithography cannot be performed.

The present invention solves the problem of accumulated stress in a surface micromachined structure having at least five and generally six or more layers of polysilicon by providing one or more stress-compensation layers on the opposite side of the substrate to balance out the accumulated stress and thereby reduce bowing of the substrate to a level that allows further processing to complete the buildup of a particular MEM structure.

SUMMARY OF THE INVENTION

The present invention relates to a process for fabricating a microelectro-mechanical (MEM) structure on a device side of a substrate. Fabrication of the MEM structure is performed by partially building up the MEM structure by depositing and patterning a plurality of layers of polysilicon on the device side of the substrate with each adjacent pair of polysilicon layers being separated by a layer of a sacrificial material. An accumulated stress in the layers of polysilicon and the sacrificial material, even after one or more annealing steps performed during buildup of the MEM structure, is of sufficient magnitude to produce a bowing of the substrate, with the initially planar substrate being bowed with a radius of curvature that is less than a critical value which is generally in the range of 10–20 meters. This radius of curvature can prevent further buildup of the MEM structure due to limitations imposed by certain semiconductor processing tools (e.g. photolithographic projection steppers, vacuum chucks, vacuum wands, etc.). To reduce the bowing of the substrate and to increase the radius of curvature above the critical value, a stress-compensation layer is deposited on a backside of the substrate opposite the device side. Then, at least one additional layer of polysilicon can be deposited and patterned on the device side of the substrate to complete the build-up of the MEM structure. The process of the present invention can further include a step for removing the sacrificial material by selective etching to release the MEM structure for movement. This removal step (termed herein an etch release step) can performed during fabrication of the MEM structure, or at a later time (e.g. by a customer or end-user when the MEM structure is fabricated by a foundry). The step for removing the sacrificial material can also remove the stress-compensation layer partially or entirely.

The sacrificial material preferably comprises silicon dioxide or a silicate glass; and the stress-compensation layer comprises silicon dioxide or the sacrificial material. The process of the present invention can be used to form MEM structures having up to six or more layers of polysilicon, including a layer of polysilicon which is patterned to form electrical wiring to the MEM structure.

In building up the MEM structure, chemical-mechanical polishing (CMP) can be used to planarize one or more layers of the sacrificial material. To reduce a print-through of features from one patterned polysilicon layer to an overlying polysilicon layer due to a spatially varying stress in an intervening layer of the sacrificial material, the annealing step can be performed prior to planarizing the layer of the sacrificial material by CMP Patterning of each polysilicon layer can be performed by masking and etching the polysilicon layer. Alternately, an underlying layer of the sacrificial material can be masked and etched to form a mold wherein a subsequent polysilicon layer can be deposited to define features of the MEM structure being built up on the substrate. The radius of curvature of the device side of the substrate can be determined by reflecting a light beam off the device side of the substrate.

The present invention further relates to a process for fabricating a MEM structure on a device side of a substrate, comprising steps for partially building up the MEM structure by depositing and patterning a plurality of alternating layers of polysilicon and a sacrificial material; measuring a radius of curvature of the substrate by reflecting a light beam off the device side of the substrate, with the radius of curvature being due to a bowing of the substrate that arises from an accumulated stress in the layers of polysilicon and the sacrificial material which cannot be completely eliminated by a step for annealing the substrate; depositing a stress-compensation layer on a backside of the substrate opposite the device side when the measured radius of curvature is less than a critical value; and repeating steps (a)–(c) at least one more time to complete the buildup of the MEM structure. This process can further include steps for removing the sacrificial material to release the MEM structure for movement, and removing at least one stress-compensation layer from the backside of the substrate. The MEM structure formed according to the present invention can comprise six or more layers of polysilicon, with elements of the MEM structure being formed from the various layers of polysilicon.

As described previously, the sacrificial material can comprise silicon dioxide or a silicate glass; and the stress-compensation layer can comprise silicon dioxide or the sacrificial material. The critical value for the radius of curvature is generally in the range of 10–20 meters, and can be arbitrarily selected or determined by a particular semiconductor processing tool. The above process can further include a step for planarizing at least one layer of the sacrificial material by chemical-mechanical polishing, with the annealing step preferably being performed prior to the planarizing step to reduce a print-through of features from an underlying polysilicon layer.

The present invention also relates to a process for fabricating a MEM structure on a device side of a substrate, comprising steps for depositing and patterning a plurality of alternating layers of polysilicon and a sacrificial material (e.g. silicon dioxide or a silicate glass) to partially build up the MEM structure on the device side of the substrate, with the layers of polysilicon and the sacrificial material having an accumulation of stress therein resulting in a bowing of the substrate; depositing a stress-compensation layer (e.g. comprising silicon dioxide or the sacrificial material) on a backside of the substrate opposite the device side when a radius of curvature of the substrate due to the bowing of the substrate is below a critical value (e.g. 10–20 meters radius of curvature), with the stress-compensation layer increasing the radius of curvature above the critical value; and repeating steps (a)–(c) at least one more time to complete the buildup of the MEM structure on the substrate. The process can further include one or more steps for determining the radius of curvature of the substrate.

The process can also include at least one step for annealing the substrate to reduce the accumulation of stress in the layers of polysilicon and the sacrificial material. The annealing step can be performed prior to determining the radius of curvature of the substrate, or after the step for depositing the stress-compensation layer, or both. At least one layer of the sacrificial material is patterned by a planarizing step comprising chemical-mechanical polishing, with the annealing step preferably being performed prior to the planarizing step to minimize print-through.

Once the MEM structure is completely built up, a step for removing the sacrificial material from the device side of the substrate can be used to release the MEM structure for movement. This step is generally performed using a selective wet etchant. The selective wet etchant can also be used to remove one or more of the stress-compensation layers from the backside of the substrate. This process is useful for forming MEM structures having up to six or more layers of polysilicon.

Additional advantages and novel features of the invention will become apparent to those skilled in the art upon examination of the following detailed description thereof when considered in conjunction with the accompanying drawings. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

Figure 1:
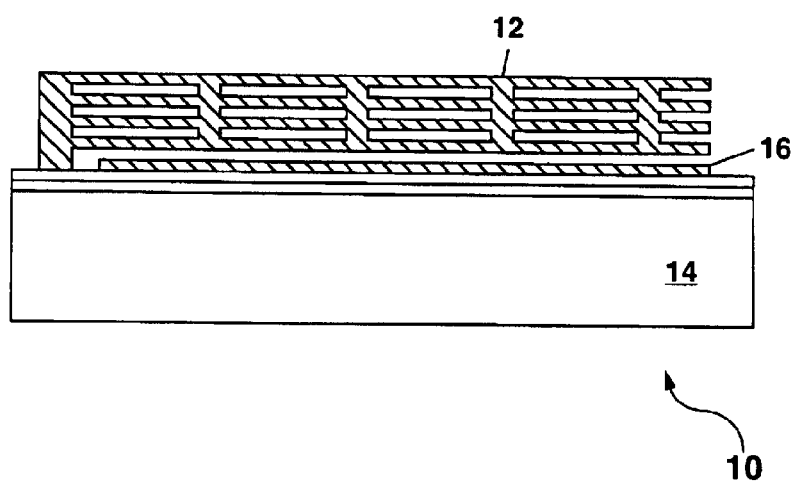
FIG. 1 schematically illustrates a cross-section view of a MEM structure formed according to one embodiment of the present invention.

Referring to FIG. 1, there is shown a schematic representation of a MEM structure 10 fabricated according to a first embodiment of the present invention. The MEM structure 10 in FIG. 1 is a cantilevered beam 12 formed on a substrate 14 from a plurality of stacked and interconnected layers of polycrystalline silicon (also termed polysilicon). The MEM structure 10 in FIG. 1 further includes a ground plane 16 underlying the cantilevered beam 12.

The MEM structure 10 in FIG. 1 is not meant to illustrate any particular MEM device, but instead to provide a simple example for explaining the fabrication processes of the present invention. Those skilled in the art will understand that the structure 10 of FIG. 1 has applications for forming many different types of MEM devices. For example, the MEM structure 10 of FIG. 1 can represent one finger of a fixed electrostatic comb which can be enmeshed with a moveable electrostatic comb of similar construction to form an electrostatic comb actuator similar to that disclosed in U.S. Pat. No. 6,133,670, which is incorporated herein by reference. As another example, the MEM structure 10 of FIG. 1 can be used to form a pivotless compliant structure as disclosed in U.S. Pat. No. 6,175,170 to Kota et al, which is incorporated herein by reference. Those skilled in the art will further understand that the teachings of the present invention can be applied to fabricate any type of MEM structure having at least five or six layers of polysilicon, with one layer of polysilicon generally being reserved to form electrical wiring to the MEM device and to form a ground plane underlying certain elements of the MEM device, and with the remaining polysilicon layers being structural.

Fabrication of the MEM structure 10 of FIG. 1 can be performed using the process described hereinafter with reference to FIGS. 2A–2K.

Figure 2A:
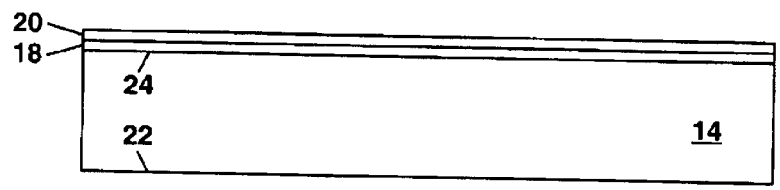
FIGS. 2A–2K show cross-section views of the MEM structure of FIG. 1 to illustrate how the process of the present invention can be used to build up the MEM structure layer by layer.

In FIG. 2A, the substrate 14, which can comprise a silicon substrate or a silicon-on-insulator substrate, is initially prepared by blanketing the substrate 14 with a layer of thermal oxide 18 (about 600 nanometers thick) formed by a conventional wet oxidation process at an elevated temperature (e.g. 1050° C. for about 1.5 hours). A layer of low-stress silicon nitride 20 (e.g. 800 nanometers thick) can then be deposited over the thermal oxide layer using low-pressure chemical vapor deposition (LPCVD) at about 850° C. The thermal oxide and silicon nitride layers 18 and 20 provide electrical isolation from the substrate 14 for a subsequently-deposited first polysilicon layer (termed Poly-0). One or more vias can be photolithographically defined and etched through the thermal oxide and silicon nitride layers, 18 and 20, as needed so that electrical connections between the Poly-0 layer and the substrate 14 can be formed.

Those skilled in the art will understand that the thermal oxide and silicon nitride layers, 18 and 20, and other deposited layers described hereinafter can also be formed on a backside 22 of the substrate 14 opposite a device side 24 whereon the MEM structure 10 is being built up when the layers are formed in a diffusion tube furnace or deposited using a diffusion tube chemical vapor deposition (CVD) apparatus which are generally used for batch processing of semiconductor wafers. In some cases, it may be advantageous to deposit a layer on only one side of the substrate 14 using a single-sided deposition method wherein the substrate 14 is placed with one side thereof in contact with a stage so that deposition occurs only on the other side of the substrate 14. For clarity and simplicity, the various layers which may be deposited on the backside 22 of the substrate 14 will be omitted from the drawings unless they are necessary to an understanding of the present invention.

Figure 2B:
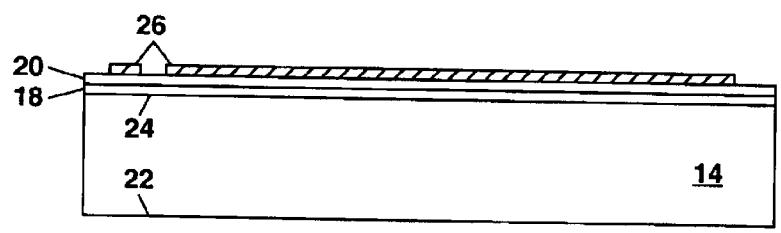

In FIG. 2B, the Poly-0 layer 26, which can be about 300 nanometers thick, is deposited by LPCVD at about 580° C. to blanket the substrate 14 and the thermal oxide and silicon nitride layers. Phosphorous doping can be used to make the Poly-0 layer 26 and other polysilicon layers electrically conductive. The Poly-0 layer 26 on the device side 24 of the substrate 14 can then be patterned as shown in FIG. 2B by photolithographic definition and etching (e.g. reactive ion etching) to form the ground plane 16, to form electrical wiring as needed (e.g. to the cantilevered beam 12) and for use in building up the cantilevered beam 12 or other elements (not shown) of the MEM structure 10.

The term "patterning" as used herein refers to a sequence of well-known semiconductor processing steps including applying a photoresist to the substrate 14, prebaking the photoresist, aligning the substrate 14 with a photomask, exposing the photoresist through the photomask, developing the photoresist, baking the wafer, etching away the surfaces not protected by the photoresist, and stripping the protected areas of the photoresist so that further processing can take place. The term "patterning" can further include the formation of a hard mask (e.g. comprising about 500 nanometers of a silicate glass deposited from the decomposition of tetraethylortho silicate, also termed TEOS, by low-pressure chemical vapor deposition at about 750° C. and densified by a high temperature processing) overlying a polysilicon or sacrificial material layer in preparation for defining features into the layer by etching.

Figure 2C:
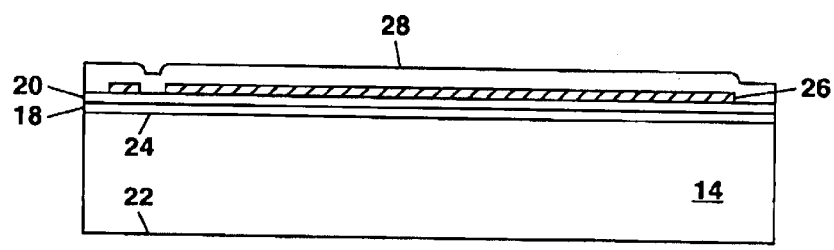

In FIG. 2C, a layer of a sacrificial material 28 is blanket deposited over the substrate 14 draping into spaces between the patterned Poly-0 layer 26 and completely covering the Poly-0 layer 26. The first layer of the sacrificial material 28 can comprise silicon dioxide ($SiO_2$) or a silicate glass (e.g. a plasma-enhanced CVD oxide, also termed PECVD oxide; or a silicate glass deposited from the decomposition of TEOS as described above).

In FIG. 2C, the sacrificial material 28 is generally deposited to a greater thickness than needed so that the layer of the sacrificial material 28 can be planarized down to a predetermined layer thickness (e.g. 1–2 μm) by chemical-mechanical polishing (CMP) to present a smooth planar surface topography for subsequent processing. Planarizing the sacrificial material 28 helps to prevent topographic variations from building up across the device surface of the substrate 14 as subsequent layers of polysilicon are deposited and patterned. Chemical-mechanical polishing is well known in the art, and is disclosed, for example, in U.S. Pat. No. 5,804,084 to Nasby et al, which is incorporated herein by reference. The use of CMP permits the layer thickness of each layer of the sacrificial material 28 to be precisely adjusted, maintains a planar topography during build up of the MEM structure 10, and eliminates any stringers which might otherwise occur as a result of anisotropic etching (e.g. reactive ion etching) which could otherwise possibly result in mechanical interferences during motion of elements of a MEM device which are formed in adjacent polysilicon layers. Chemical-mechanical polishing can also optionally be used to planarize one or more of the layers of polysilicon.

Planarizing the sacrificial material 28 can be performed either before or after a step for annealing the substrate 14 to reduce stress within the layers of polysilicon and the sacrificial material. The annealing step can be performed at an elevated temperature (e.g. 1100° C.) for a few hours (e.g. 3 hours) in a nitrogen ambient. A separate annealing step can be performed after deposition and patterning of each subsequent polysilicon layer once that layer has been blanketed by a deposited layer of the sacrificial material 28.

Figure 3A:
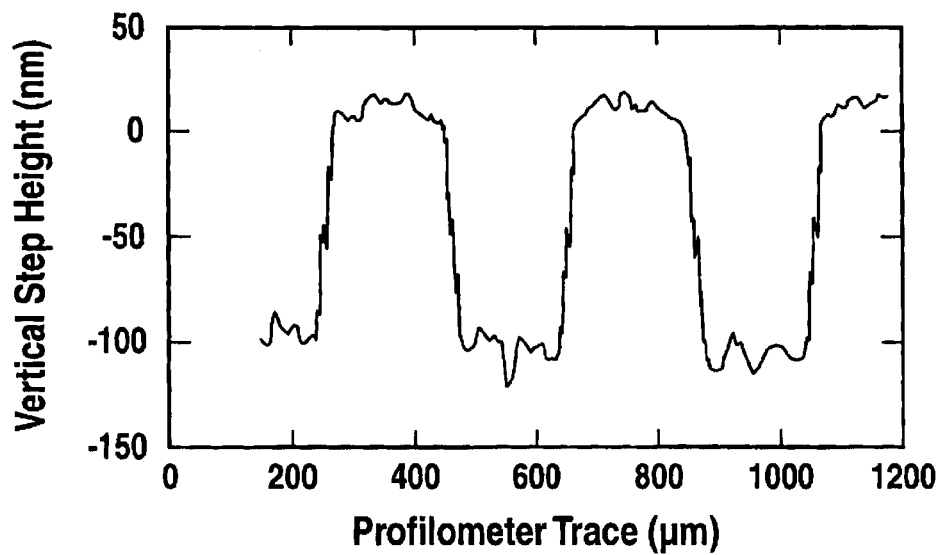
FIG. 3A shows a profilometer trace across a planarized layer of the sacrificial material to illustrate a vertical step height that can occur due to print-through from an underlying layer of patterned polysilicon when a chemical-mechanical polishing (CMP) step is performed to planarize the surface of the sacrificial material prior to annealing the substrate.
Figure 3B:
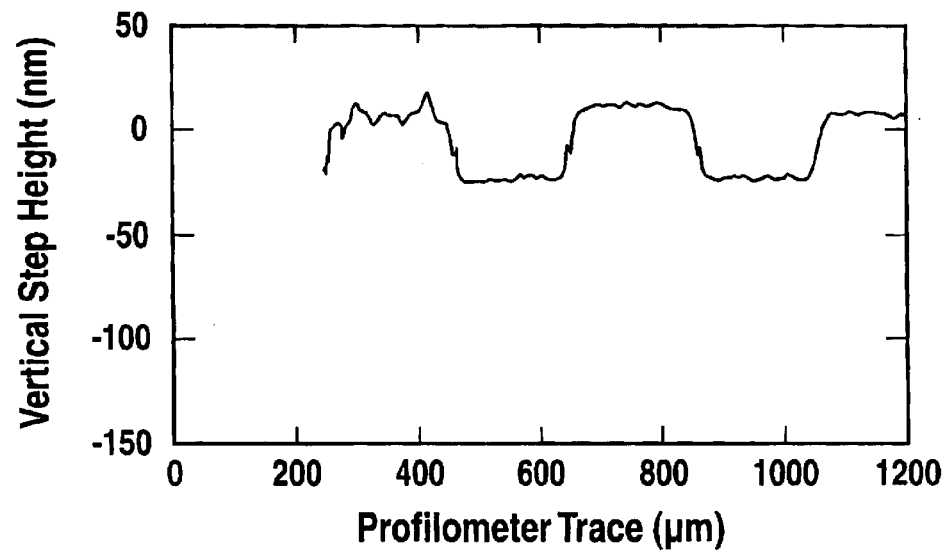
FIG. 3B shows a profilometer trace that illustrates how the vertical step height can be substantially reduced by performing the annealing step prior to planarizing the layer of the sacrificial material by CMP.

Performing the annealing step before planarizing the sacrificial material 28 can be advantageous for reducing a print-through of features from an underlying polysilicon layer as is shown in FIGS. 3A and 3B. The print-through arises from the stress in the polysilicon and sacrificial material which is relaxed during the annealing step leading to localized changes in the thickness of the polysilicon and sacrificial material layers. When the CMP step is performed prior to the annealing step, the stress relaxation can result in print-through of features in the underlying polysilicon layer with a step height on the order of 100 nanometers (nm) as shown in the profilometer trace of FIG. 3A. However, by performing the annealing step prior to the CMP step, the print-through can be substantially reduced as shown in FIG. 3B. Therefore, according to the present invention, it is preferable to perform the annealing step prior to the CMP step when print-through of features in the underlying polysilicon layer is to be minimized.

Figure 2D:
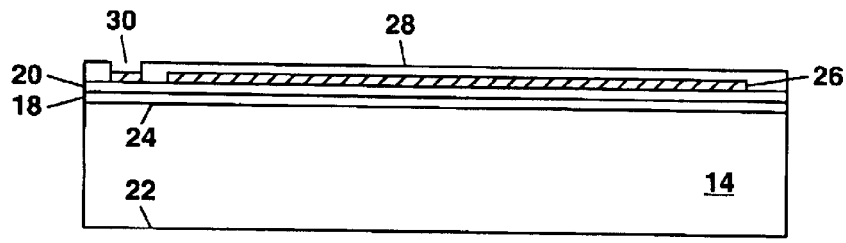
Figure 2E:
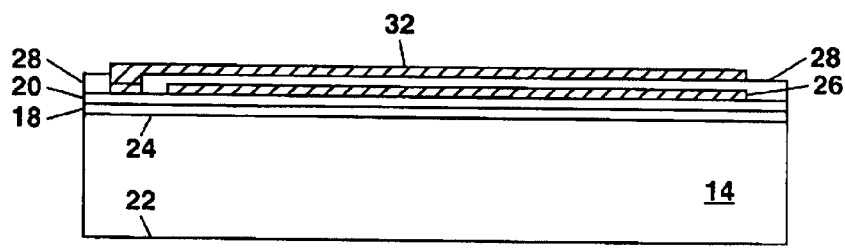

In FIG. 2D, after the CMP step, one or more openings 30 can be photolithographically defined and etched (e.g. by reactive ion etching) through the first layer of the sacrificial material 28 to the underlying Poly-0 layer 26 at locations wherein a second polysilicon layer 32 (termed Poly-1) is to be connected to the Poly-0 layer 26. The Poly-1 layer 32 and each subsequently deposited polysilicon layer can be deposited on both sides of the substrate 14 by LPCVD at 580° C. The Poly-1 layer 32 can be, for example, 1 μm thick. After deposition, the Poly-1 layer in FIG. 2E can be patterned to define elements of the MEM structure 10 being built up on the substrate.

Figure 2F:
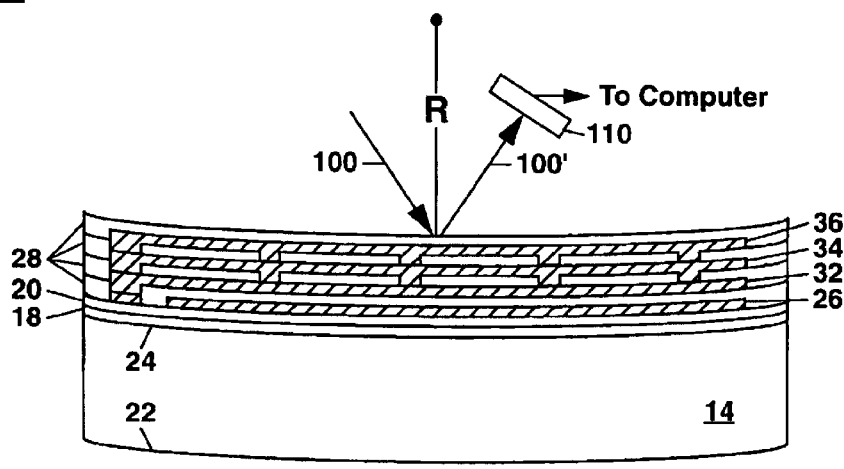

The steps described previously with reference to FIGS. 2C–2E can be repeated multiple times to further build up the MEM structure 10. Each additional polysilicon layer (designed Poly-2, Poly-3, Poly-4 etc.) and each additional layer of the sacrificial material 28 contribute to an accumulation of stress on the device side 24 of the substrate 14 since, while the stress in the polysilicon layers can be nearly completely eliminated by the annealing steps, the stress in the sacrificial material 28 remains to a large extent. Even after annealing, the sacrificial material 28 can exhibit a compressive stress of about 300–330 MegaPascals (MPa). As a result, the substrate 14 becomes more bowed with each additional layer of polysilicon and sacrificial material. This is schematically illustrated in FIG. 2F which shows the addition of a Poly-2 layer 34 which can be, for example, 1.5 $\mu$m thick and the addition of a Poly-3 layer 36 which can be, for example, 2.25 $\mu$m thick. The layer of the sacrificial material 28 between the Poly-1 layer 32 and the Poly-2 layer 34 can be, for example, 0.3 $\mu$m thick; and the layer of the sacrificial material 28 between the Poly-2 layer 34 and the Poly-3 layer 36 can be 2 $\mu$m thick.

With each added layer of polysilicon and the sacrificial material 28, a radius of curvature of the substrate 14 becomes smaller as the substrate 14, which was initially planar, becomes more bowed by the accumulated stress. Once the bowing of the substrate 14 produces a radius of curvature that is smaller than a critical value (generally in the range of 10–20 meters), then further buildup of the MEM structure 10 must be halted until the bowing of the substrate 14 can be alleviated and the substrate 14 flattened so that the radius of curvature is increased to above the critical value, and preferably to a radius of curvature that is about 30 meters or more.

The critical value of the radius of curvature of the substrate 14 can be arbitrarily set or can be determined by requirements imposed by particular semiconductor processing tools (e.g. photolithographic projection steppers, vacuum chucks, vacuum wands, and automated wafer handling equipment) used to fabricate the MEM structure 10 since these semiconductor processing tools have limitations as to the minimum radius of curvature that they can handle without the possibility for damaging the substrate 14 and the MEM structure 10 being built up thereon (i.e. the semiconductor processing tools are primarily designed for handling flat substrates, but can also handle substrates having a radius of curvature greater than the critical value). The bowing of the substrate 14 can also affect deposition and reactive ion etching since the backside 22 of the substrate 14 will no longer be in good thermal contact with a stage whereon the substrate 14 is held during single-side deposition of subsequent layers, or during reactive ion etching of the layers of polysilicon and the sacrificial material 28. The bowing of the substrate 14 can result in temperature differences across the substrate 14; and these temperature differences can result in non-uniform deposition or etching, thereby affecting the quality of the MEM structure 10 being built up on the substrate 14.

With the above layer thicknesses for the various polysilicon and sacrificial material layers, a compensating stressed layer 38 (termed hereinafter a stress-compensation layer) will generally be needed on the backside 22 of the substrate 14 after the deposition and patterning of the Poly-3 layer 36 and overcoating the Poly-3 layer 36 with an additional layer of the sacrificial material 28, or at the latest after the deposition and patterning of an additional polysilicon layer (i.e. a Poly-4 layer). The provision of the stress-compensation layer 38 immediately after the Poly-3 layer 36 and the overlying layer of the sacrificial material 28 allows the Poly-3 layer to be protected from possible damage (e.g. scratching) by the overlying layer of the sacrificial material 28 which has not yet been planarized when the substrate 14 is mounted upside down in a single-sided deposition system to apply the stress-compensation layer 38 only on the backside 22 of the substrate 14. A later planarization of the overlying layer of the sacrificial material 28 can remove any damage to this layer. Such protection is generally not possible when the stress-compensation layer 28 is applied immediately after deposition and patterning of the Poly-4 layer.

The exact point in the buildup of the MEM structure 10 where the stress-compensation layer 38 is required can be determined by periodically measuring the bowing of the substrate 14. This can be done as shown in FIG. 2F by directing a light beam 100 (generally a laser beam) onto the substrate 14 (e.g. onto the device surface 24, or onto the backside 22) at a known angle and measuring a reflected light beam 100' using a position sensitive photodetector 110. The reflected light beam 100' can be measured as a function of position across the substrate 14 by scanning the substrate 14. From these measurements and from the position of the substrate 14, which are provided as inputs to a computer, the radius of curvature of the bowed substrate 14 can be calculated. A commercial wafer flatness measurement tool as known to the art (e.g. a KLA-Tencor Corp. Model FLX-2320 film stress measurement system) can be used to perform the substrate radius of curvature measurement. The use of a laser to measure the bowing of a substrate due to stress in a deposited thin film is also well known (see e.g. U.S. Pat. Nos. 5,134,303 and 5,248,889 to Blech et al, which are incorporated herein by reference).

Figure 2G:
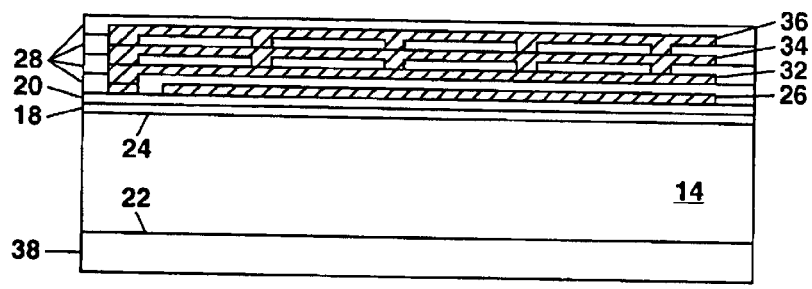

In FIG. 2G, a stress-compensation layer 38, which can comprise silicon dioxide or the sacrificial material 28, is blanket deposited on the backside of the substrate 14 to provide stress on this side of the substrate 14 that will increase the radius of curvature of the substrate 14 beyond that shown in FIG. 2F and generally to about 30 meters or more, thereby flattening the substrate 14. The stress-compensation layer 38, which can comprise silicon dioxide or the sacrificial material, is deposited by a single-sided chemical vapor deposition (CVD) process (e.g. PECVD) so that the layer 38 is only deposited on the backside 22 of the substrate 14. In such a deposition process, the substrate 14 is placed on a heated stage in a CVD apparatus so that the backside 22 of the substrate 14 is exposed for deposition, and the device side 24 is in contact with the stage so that deposition on this side of the substrate 14 is prevented. After deposition of the stress-compensation layer 38, an annealing step can be performed as described previously. The layer of the sacrificial material covering the Poly-3 layer 36 can then be planarized by CMP.

The exact thickness, t, of the stress-compensation layer 38 can be determined from the measurement of the radius of curvature, R, of the bowed substrate 14 in FIG. 2F using the well-known Stoney equation:

$$\sigma = \frac{1}{R} \frac{E}{6(1-v)} \frac{T^2}{t}$$

where $\sigma$ is the stress in the layer 38 (generally 300–300 MPa for an undoped silicon dioxide layer 38), $E/(1-v)$ is the biaxial modulus of the material forming the substrate 14, and T is the thickness of the substrate 14. The stress-compensation layer 38 can be, for example, about 5–6 $\mu$m thick. The stress inherent in the stress-compensation layer 38 helps to balance the stress of the various layers deposited on the device side 24 of the substrate 14, and this unbows the substrate 14 thereby increasing the radius of curvature above the critical value. Ideally, a thickness for the stress-compensation layer 38 would be selected to completely restore the substrate 14 to a flat condition, or to even bow the substrate 14 slightly in the opposite direction to compensate for the stress of any additional polysilicon or sacrificial material layers to be deposited on the device side 24 to complete the buildup of the MEM structure 10.

Figure 2H:
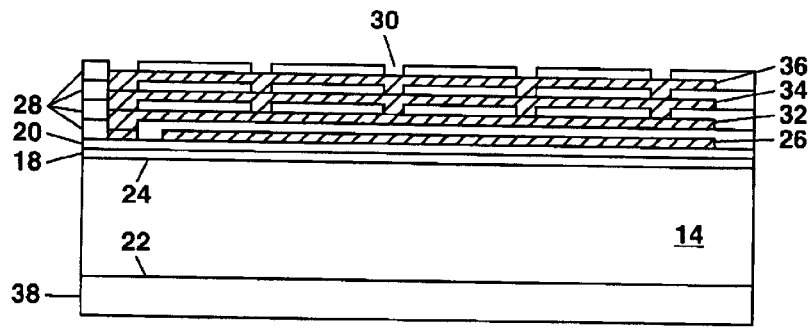
Figure 2I:
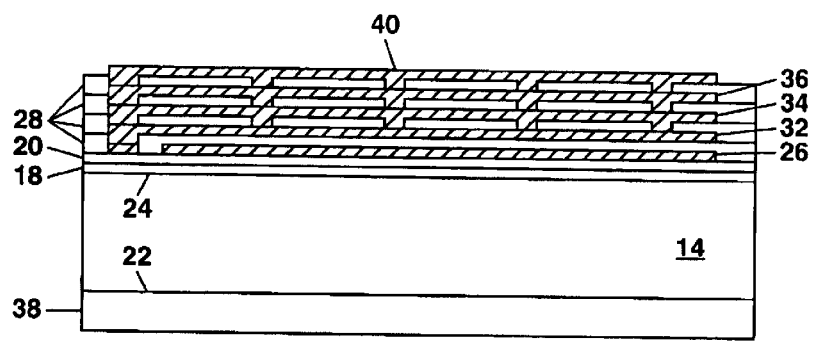
Figure 2J:
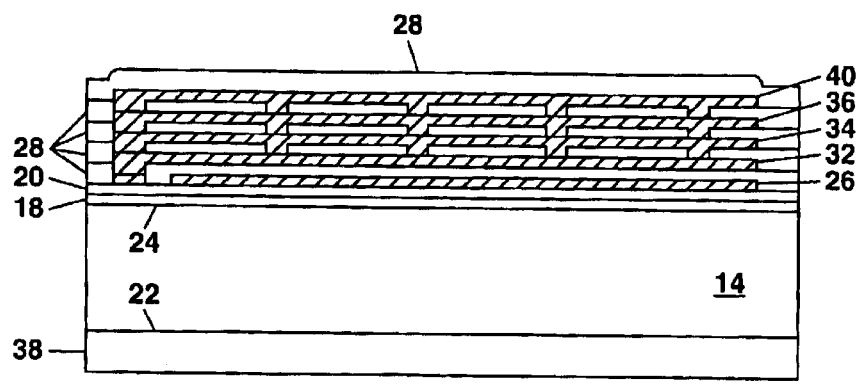
Figure 2K:
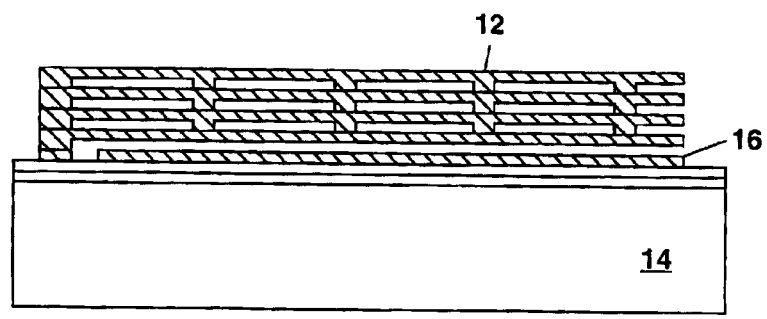

In FIG. 2H, once the stress-compensation layer 38 has been formed on the backside 22 of the substrate 14, further build-up of the MEM structure 10 can continue. In FIG. 2H, the layer of sacrificial material 28 covering the Poly-3 layer 36 is patterned to form a plurality of openings 30 to the underlying Poly-3 layer 36. In FIG. 2K, a Poly-4 layer 40 is deposited over the substrate 14 and patterned to form another layer of the MEM structure 10.

In one embodiment of the present invention, the Poly-4 layer 40 completes the buildup of the MEM structure 10. In this embodiment of the present invention, a final layer of the sacrificial material 28 is blanket deposited over the substrate 14 as shown in FIG. 2J, prior to a final step for annealing the substrate 14. There is no need to planarize this final layer of the sacrificial material 28 since the MEM structure 10 has been completely built up. In other embodiments of the present invention, additional layers of polysilicon and the sacrificial material 28 can be provided as described previously so that the MEM structure 10 comprises six or more layers of polysilicon.

In FIG. 2K, the various layers of the sacrificial material 28 and the stress-compensation layer 38 are removed by selective etching with an etchant comprising hydrofluoric acid (HF) which etches away at least a part of the sacrificial material 28 but which does not substantially attack the various layers of polysilicon. This etching step, which can be performed for several hours or overnight, releases the MEM structure 10 for movement by removing the sacrificial material 28 which surrounded the polysilicon layers during fabrication of the structure 10.

To remove the stress-compensation layer 38 using the selective etchant comprising HF, this layer must be exposed to the selective etchant. When the stress-compensation layer 38 is covered by a layer of polysilicon (e.g. when the Poly-4 layer 40 is deposited in a diffusion tube CVD apparatus and covers both sides of the substrate 14), then the polysilicon layer on the backside 22 of the substrate 14 must be removed, at least in part, to expose the stress-compensation layer 38. This can be done by either a dry etching step (e.g. reactive ion etching with an HBr plasma), or by a selective wet etchant comprising, for example, potassium hydroxide (KOH). Alternately, the polysilicon layer can be removed from the backside 22 of the substrate 14 by a polishing step (e.g. CMP). In some instances (e.g. when the substrate 14 is diced into a plurality of die each containing the MEM structure 10 before the etch release step) it may be possible to leave the stress-compensation layer 38 in place along with any overlying polysilicon layers.

In other embodiments of the present invention, additional polysilicon layers beyond the Poly-4 layer 40 may be needed to complete the buildup of the MEM structure 10. In these embodiments of the present invention, additional stress-compensation layers can be provided on the backside 22 of the substrate 14 at predetermined points in a process sequence as determined from measurements of the radius of curvature of the substrate 14 as previously described. The provision of multiple stress-compensation layers can allow the fabrication of MEM structures having six or more layers of polysilicon, limited only by constraints on a total overall substrate thickness which can be tolerated by the semiconductor processing tools used to fabricate the MEM structure 10.

Another embodiment of the present invention wherein multiple stress-compensation layers are provided on the substrate 14 to fabricate a MEM structure 10 will be described hereinafter with reference to FIGS. 4A–4H.

Figure 4A:
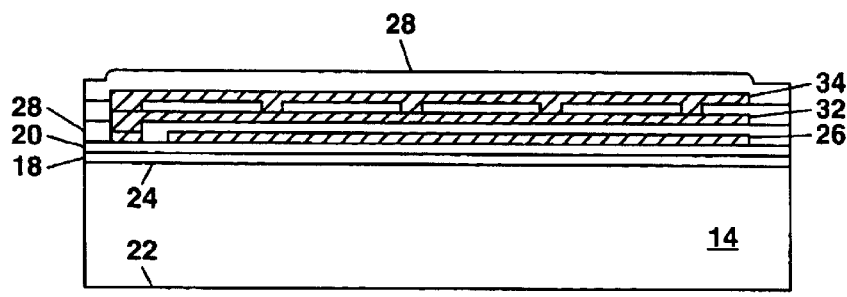
FIGS. 4A–4H show cross-section views of a MEM structure to illustrate another embodiment of the process of the present invention.

In FIG. 4A, buildup of the MEM structure 10 through the Poly-2 layer 34 can proceed as described previously with reference to FIGS. 2A–2F, and then the substrate 14 can be overcoated with a layer of the sacrificial material 28 which can be, for example, 2–3 $\mu$m thick. To minimize the possibility for stress cracking in this layer of the sacrificial material 28, the layer can be deposited by a single-sided deposition process such as PECVD.

Figure 4B:
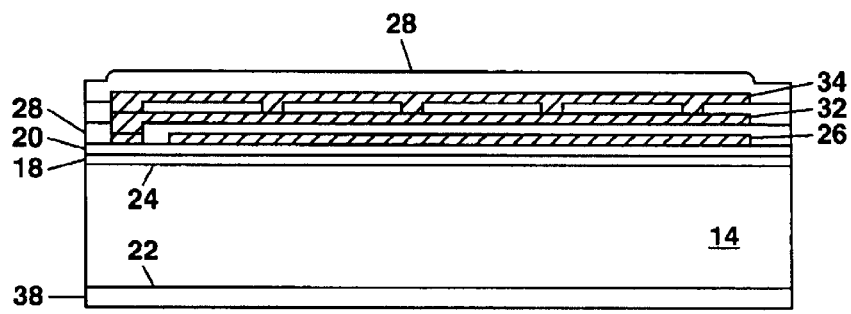

In FIG. 4B, a first stress-compensation layer 38 can be deposited on the backside 22 of the substrate 14 by PECVD. This first stress-compensation layer 38 can be, for example, 2 $\mu$m thick, and can be provided on the backside 22 of the substrate 14 when the radius of curvature is less than a critical value which can be arbitrarily chosen to limit the extent of bowing of the substrate 14 during buildup of the MEM structure 10. As an example, the critical value can be arbitrarily set at 20 meters radius of curvature, although the semiconductor processing tools used to fabricate the MEM structure 10 may be capable of handling substrates having a radius of curvature down to 10 meters or less. In this embodiment of the present invention, the stress-compensation layer 38 can be provided on the backside 22 of the substrate 14 to compensate for stress in layers deposited on the device side 24 of the substrate 14 and also to anticipate additional stress due to one or more additional layers yet to be deposited on the device side 24 of the substrate 14. Thus, this embodiment of the present invention utilizes a plurality of relatively thin (e.g. 2 $\mu$m) stress-compensation layers formed at various points during the buildup of the MEM structure 10 rather than relying on a single thicker (e.g. 5–6 $\mu$m) stress-compensation layer as illustrated in the embodiment of the present invention previously described with reference to FIGS. 2A–2K. After deposition of the first stress-compensation layer 38, the substrate 14 can be annealed as described previously.

Figure 4C:
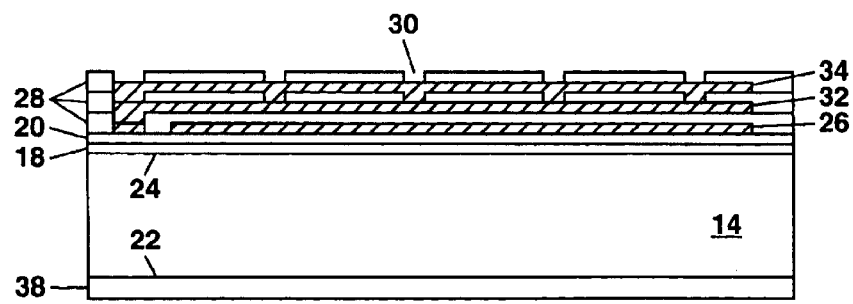

In FIG. 4C, the exposed layer of the sacrificial material 28 on the device side 24 of the substrate 14 can be planarized by CMP down to a predetermined layer thickness of, for example, 1.5–2 $\mu$m and then patterned to provide a plurality of openings 30 down to the underlying Poly-2 layer 34.

Figure 4D:
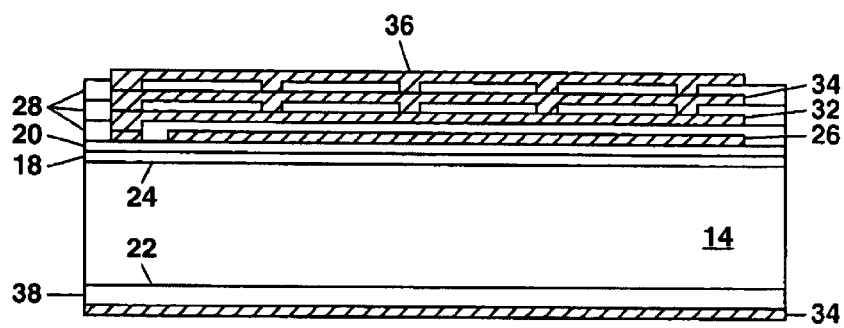

In FIG. 4D, the Poly-3 layer 36 is shown deposited on both sides of the substrate 14 which can occur when the Poly-3 layer 36 is deposited using a diffusion tube CVD apparatus (e.g. LPCVD). In other embodiments of the present invention, the various polysilicon layers can be deposited only on the device side 24. Once deposited, the Poly-3 layer 36 on the device side 24 can be patterned as shown in FIG. 4D to further build up the MEM structure 10 being formed on the substrate 14.

Figure 4E:
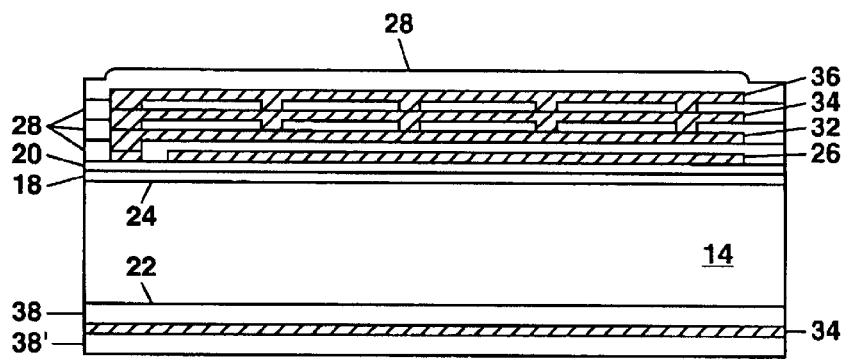

In FIG. 4E, an additional layer of the sacrificial material 28 about 2–3 $\mu$m thick is deposited over the substrate 14 using PECVD. A second 2-$\mu$m-thick stress-compensation layer 38' is then deposited on the backside 22 of the substrate 14 by PECVD in a separate deposition step. After deposition of the sacrificial material 28 and the second stress-compensation layer 38', the substrate can be annealed as described previously.

Figure 4F:
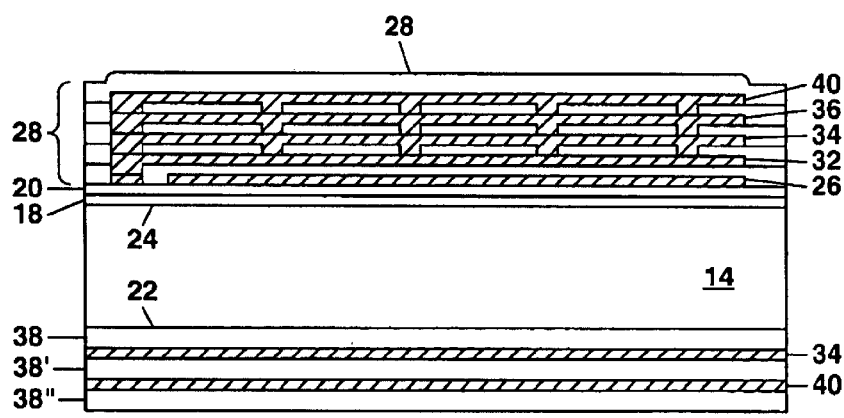

In FIG. 4F, the deposition and patterning steps described with reference to FIGS. 4C–4E can be repeated again to form a patterned Poly-4 layer 40 overlying a layer of patterned sacrificial material 28, with a third stress-compensation layer 38″ being formed on the backside 22 of the substrate 14. The layers 38″ and 40 can be, for example, about 2 μm thick; and the layer of the sacrificial material 28 overlying the Poly-4 layer 40 can be 2–3 μm thick as deposited.

The steps described previously with reference to FIGS. 4C–4E can be repeated as many additional times as are necessary to complete the build up of the MEM structure 10. For example, to form a MEM structure 10 having six layers of deposited and patterned polysilicon, the steps of FIGS. 4C and 4E can be repeated yet one more time as shown in FIG. 4H to form a Poly-5 layer 42 and a fourth stress-compensation layer 3‴, with each layer 3‴ and 42 being, for example, about 2 μm thick, and with the layer of the sacrificial material 28 overlying the Poly-5 layer 42 being 2–3 μm thick as deposited. Those skilled in the art will understand that the exact thickness of each stress-compensation layer 38 will depend upon the amount of stress to be compensated for in the various layers on the device side 24 of the substrate 14; and this required thickness for each stress-compensation layer 38 can be determined by measuring the radius of curvature prior of the substrate 14 prior to deposition of each stress-compensation layer 38 as described previously, and then using the Stoney equation to calculate the required thickness for that stress-compensation layer.

Once the build-up of the MEM structure 10 has been completed, the structure 10 can be released by removing the various layers of the sacrificial material 28 using a selective etchant comprising HF as described previously with reference to FIG. 2K. If the substrate 14 has been diced to form a plurality of die each containing a MEM structure 10 prior the etch release step, then removal of the various stress-compensation layers 38 on the backside 22 of the substrate 14 can be optional since the presence of these stress-compensation layers 38 will generally not result in a substantial bowing of the individual die due to the small fraction-of-an-inch size of the die as compared to the substrate 14 which is generally 4–8 inches in diameter. On the other hand, if the etch release step is performed on an entire substrate (also termed a wafer), then the removal of at least a portion of the stress-compensation layers 38 will generally be necessary to prevent bowing of the substrate 14 in the opposite direction after the etch release step. To aid in removal of the various stress-compensation layers 38, one or more of the polysilicon layers 42, 40 and 34 on the backside 22 of the substrate 14 can be removed as needed by reactive ion etching (e.g. using an HBr plasma) to expose an underlying stress-compensation layer 38 for removal by the selective etchant comprising HF. Alternately, a plurality of openings can be formed through one or more of the polysilicon layers to allow the selective etchant to reach the underlying stress-compensation layer 38 for removal thereof.

Figure 4G:
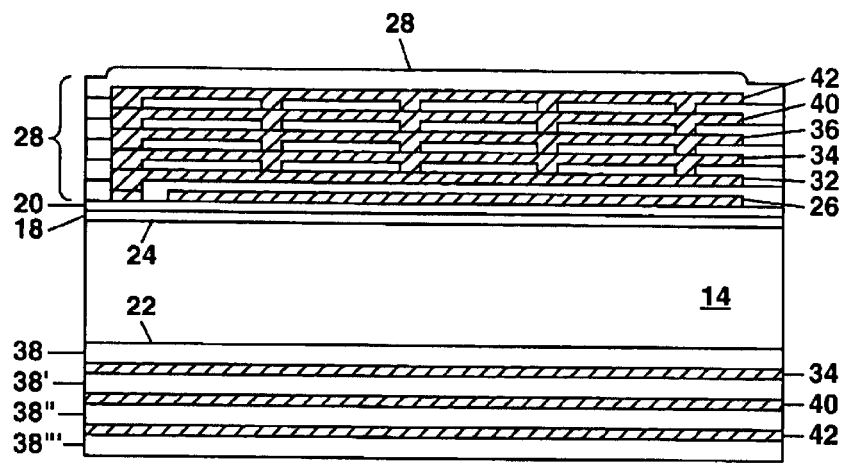
Figure 4H:
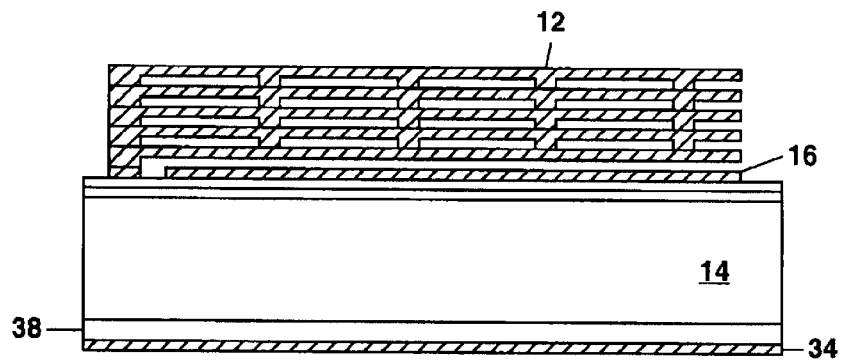

FIG. 4H schematically illustrates the released MEM structure 10 from FIG. 4G with all but one of the stress-compensation layers 38 removed.

Other applications and variations of the present invention will become evident to those skilled in the art. As an example, once the radius of curvature measurements have been made to determine the locations and thicknesses of one or more stress-compensation layers 38 to be applied to the backside 22 of the substrate 14, these measurements need not be repeated for processing additional substrates 14 to fabricate the same MEM structure 10 since the known locations and thicknesses of the various stress-compensation layers 38 can be built directly into the process flow. The matter set forth in the foregoing description and accompanying drawings is offered by way of illustration only and not as a limitation. The actual scope of the invention is intended to be defined in the following claims when viewed in their proper perspective based on the prior art.

What is claimed is:

1. A process for fabricating a microelectromechanical (MEM) structure on a device side of a substrate, comprising steps for:
    (a) partially building up the MEM structure by depositing and patterning a plurality of layers of polysilicon on the device side of the substrate with each adjacent pair of polysilicon layers being separated by a layer of a sacrificial material, and with the layers of polysilicon and the sacrificial material having an accumulated stress of a sufficient magnitude after a step for annealing the substrate to produce a bowing of the substrate characterized by a radius of curvature of the substrate which is less than a critical value;
    (b) depositing a stress-compensation layer on a backside of the substrate opposite the device side to reduce the bowing of the substrate, with the radius of curvature of the substrate being increased to more than the critical value; and
    (c) depositing and patterning at least one additional layer of polysilicon on the device side of the substrate to complete building up the MEM structure.

2. The process of claim 1 wherein the sacrificial material comprises silicon dioxide or a silicate glass.

3. The process of claim 1 wherein the stress-compensation layer comprises silicon dioxide or the sacrificial material.

4. The process of claim 1 wherein the radius of curvature of the substrate is determined by reflecting a light beam off the device side of the substrate.

5. The process of claim 1 wherein the MEM structure comprises at least six layers of polysilicon.

6. The process of claim 1 wherein the critical value for the radius of curvature is in the range of 10–20 meters.

7. The process of claim 1 further including a step for planarizing at least one layer of the sacrificial material by chemical-mechanical polishing.

8. The process of claim 7 wherein the annealing step is performed prior to the planarizing step.

9. The process of claim 1 further including a step for removing the sacrificial material to release the MEM structure for movement.

10. The process of claim 9 wherein the step for removing the sacrificial material also removes the stress-compensation layer.

11. The process of claim 1 wherein the step for patterning each polysilicon layer comprises masking and etching the polysilicon layer.

12. The process of claim 1 wherein the step for patterning each polysilicon layer comprises masking and etching an underlying layer of the sacrificial material to form a mold wherein the polysilicon layer is deposited.

13. A process for fabricating a microelectromechanical (MEM) structure on a device side of a substrate, comprising steps for:
    (a) partially building up the MEM structure by depositing and patterning a plurality of alternating layers of polysilicon and a sacrificial material;
    (b) measuring a radius of curvature of the substrate by reflecting a light beam off the substrate, with the radius of curvature being due to a bowing of the substrate that arises from an accumulated stress in the layers of polysilicon and the sacrificial material which cannot be completely eliminated by a step for annealing the substrate;

(c) depositing a stress-compensation layer on a backside of the substrate opposite the device side when the measured radius of curvature is less than a critical value; and (d) repeating steps (a)–(c) at least one more time to complete the buildup of the MEM structure.

14. The process of claim 13 further including a step for removing the sacrificial material to release the MEM structure for movement.

15. The process of claim 14 further including a step for removing at least one stress-compensation layer from the backside of the substrate.

16. The process of claim 13 wherein the MEM structure comprises at least six layers of polysilicon.

17. The process of claim 13 wherein elements of the MEM structure are formed from the layers of polysilicon.

18. The process of claim 13 wherein the sacrificial material comprises silicon dioxide or a silicate glass.

19. The process of claim 13 wherein the stress-compensation layer comprises silicon dioxide or the sacrificial material.

20. The process of claim 13 wherein the critical value for the radius of curvature is in the range of 10–20 meters.

21. The process of claim 13 further including a step for planarizing at least one layer of the sacrificial material by chemical-mechanical polishing.

22. The process of claim 21 wherein the annealing step is performed prior to the planarizing step.

23. A process for fabricating a microelectromechanical (MEM) structure on a device side of a substrate, comprising steps for:

(a) depositing and patterning a plurality of alternating layers of polysilicon and a sacrificial material to partially build up the MEM structure on the device side of the substrate, with the layers of polysilicon and the sacrificial material having an accumulation of stress therein resulting in a bowing of the substrate;

(b) depositing a stress-compensation layer on a backside of the substrate opposite the device side when a radius of curvature of the substrate due to the bowing of the substrate is below a critical value, with the stress-compensation layer increasing the radius of curvature above the critical value; and (c) repeating steps (a)–(c) at least one more time to complete the buildup of the MEM structure on the substrate.

24. The process of claim 23 further including a step for determining the radius of curvature of the substrate.

25. The process of claim 23 further including at least one step for annealing the substrate to reduce the accumulation of stress in the layers of polysilicon and the sacrificial material.

26. The process of claim 25 wherein the step for annealing the substrate is performed prior to determining the radius of curvature of the substrate.

27. The process of claim 25 wherein the step for annealing the substrate is performed after the step for depositing the stress-compensation layer.

28. The process of claim 25 wherein at least one layer of the sacrificial material is patterned by a planarizing step comprising chemical-mechanical polishing.

29. The process of claim 28 wherein the step for annealing the substrate is performed prior to the planarizing step.

30. The process of claim 23 further including a step for removing the sacrificial material from the device side of the substrate to release the MEM structure for movement.

31. The process of claim 30 further including a step for removing at least one stress-compensation layer from the backside of the substrate.

32. The process of claim 23 wherein the step for determining the radius of curvature of the substrate comprises reflecting a light beam off the substrate.

33. The process of claim 23 wherein the sacrificial material comprises silicon dioxide or a silicate glass.

34. The process of claim 23 wherein the stress-compensation layer comprises silicon dioxide or the sacrificial material.

35. The process of claim 23 wherein the critical value of the radius of curvature is in the range of 10–20 meters.

36. The process of claim 23 wherein the MEM structure comprises at least six layers of polysilicon.

* * * * *